United States Patent [19]
Coffman et al.

[11] Patent Number: 5,424,992
[45] Date of Patent: Jun. 13, 1995

[54] METHOD AND DEVICE FOR DETECTING AND CONTROLLING AN ARRAY SOURCE SIGNAL DISCHARGE FOR A MEMORY ERASE OPERATION

[75] Inventors: Tim M. Coffman, Sugar Land; Sung-Wei Lin, Houston; Dennis R. Robinson, Needville; Phat C. Truong, Houston, all of Tex.; T. Damodar Reddy, Nalgonda, India

[73] Assignee: Texas Instruments Incorporated, a Delaware corporation, Dallas, Tex.

[21] Appl. No.: 112,484

[22] Filed: Aug. 25, 1993

[51] Int. Cl.6 ............................................. G11C 13/00
[52] U.S. Cl. .................................... 365/218; 365/184; 365/204
[58] Field of Search ................. 365/218, 184, 900, 204

[56] References Cited
U.S. PATENT DOCUMENTS

| | | | |
|---|---|---|---|
| 4,057,788 | 11/1977 | Sage | 365/184 X |
| 4,649,382 | 3/1987 | Martin et al. | 359/271 X |
| 5,109,761 | 4/1992 | Yim et al. | 365/900 X |
| 5,270,980 | 12/1993 | Pathak et al. | 365/184 X |
| 5,280,454 | 11/1994 | Tanaka et al. | 365/218 |

Primary Examiner—Do Hyun Yoo
Attorney, Agent, or Firm—Theodore D. Lindgren; Leo N. Heiting; Richard L. Donaldson

[57] ABSTRACT

An array source signal discharge controller device (10) includes a pulse converter circuit (12) that receives an erase pulse signal (ERPULSE). The pulse converter circuit (12) converts the erase pulse signal (ERPULSE) into a pulse control signal (ERPCL) that is subsequently translated into a higher voltage level bias signal (ECL_). The higher voltage level bias signal (ECL_) drives array source signal generator circuits (16) that produce array source signals (AS) to erase particular array subsections of memory as determined by a selection circuit (17). The array source signal generator circuits (16) also generate array source command signals (ASCOM_) to indicate a discharging status of all array source signals (AS). An erase completion detector circuit (18) monitors the array source command signals (ASCOM_) and generates an array source detect signal (ASDET) to indicate completion of array source signal (AS) discharging. The pulse converter circuit (12) receives the array source detect signal (ASDET) and generates an erase completion signal (ERCTR) and a pulldown control signal ERCTR_ to control final discharge of the array source signals (AS) and indicate that normal memory access may resume. The pulse converter circuit (12) also generates a pulldown signal (ERD_) that controls discharge of the array source signals (AS) by preventing current surges from appearing on the array source signals (AS) during discharge.

3 Claims, 4 Drawing Sheets

METHOD AND DEVICE FOR DETECTING AND CONTROLLING AN ARRAY SOURCE SIGNAL DISCHARGE FOR A MEMORY ERASE OPERATION

TECHNICAL FIELD OF THE INVENTION

The present invention relates in general to integrated circuit devices and more particularly to a method and device for detecting and controlling an array source signal discharge for a memory erase operation.

BACKGROUND OF THE INVENTION

Conventional programmable read only memories allow a user to erase all or portions of the memory contents as desired. These memory devices, such as erasable programmable read only memories and electrically erasable programmable read only memories, require a higher voltage level signal such as twelve volts during the erase mode as compared to a typical memory operation voltage level of five volts. A twelve volt source signal is applied to each separate array source in the memory desired for erasure during a memory erase operation and normal memory access can begin once the twelve volt array source signals to each array have been reduced to zero volts.

Conventional memories allow resumption of normal memory access, such as read and write operations from and to memory, respectively, after a fixed period of time following a memory erase operation to allow the twelve volt array source signals to discharge down to zero volts. This fixed time duration is set to ensure that the twelve volt array source signals have fully discharged down to zero volts before normal memory access can proceed. Conventional memory devices solely rely on the fixed time duration before proceeding with normal memory access. Therefore, it is desirable to have a memory device that does not rely on a fixed time duration to ensure that the array source signals have completely discharged before normal memory access may resume.

SUMMARY OF THE INVENTION

From the foregoing, it may be appreciated that a need has arisen for a device that monitors the discharge of an array source signal during a memory erase operation. A need has also arisen for a device that controls the discharge of the array source signal. Further, a need has arisen for a memory device that can resume normal memory access immediately after discharge of the array source signal following a memory erase operation.

In accordance with the present invention, a method and device for detecting and controlling discharge of an array source signal for a memory erase operation are provided which substantially eliminate and reduce disadvantages and problems associated with conventional erasable memory devices.

According to an embodiment of the present invention, there is provided a device for detecting and controlling discharge of an array source signal for a memory erase operation that includes circuitry for receiving an erase pulse signal and converting the erase pulse signal into a pulse control signal. The pulse control signal is translated by circuitry into an appropriate higher voltage level control signal required for a memory erase operation. The higher voltage level control signal is used in generating an array source signal that activates a memory to perform a memory erase operation on a specific portion of the memory. Further circuitries are included to detect a voltage level of the array source signal in order to monitor its discharge and determine the point at which normal memory access can resume.

The method and device of the present invention provide various technical advantages over conventional erasable memory devices. For example, one technical advantage is in detecting the voltage level of the array source signal. Another technical advantage is in controlling the discharge of the array source signal. Yet another technical advantage is in the ability to resume normal memory access immediately after discharge of the array source signal following a memory erase operation. Other technical advantages are readily apparent to one skilled in the art by the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
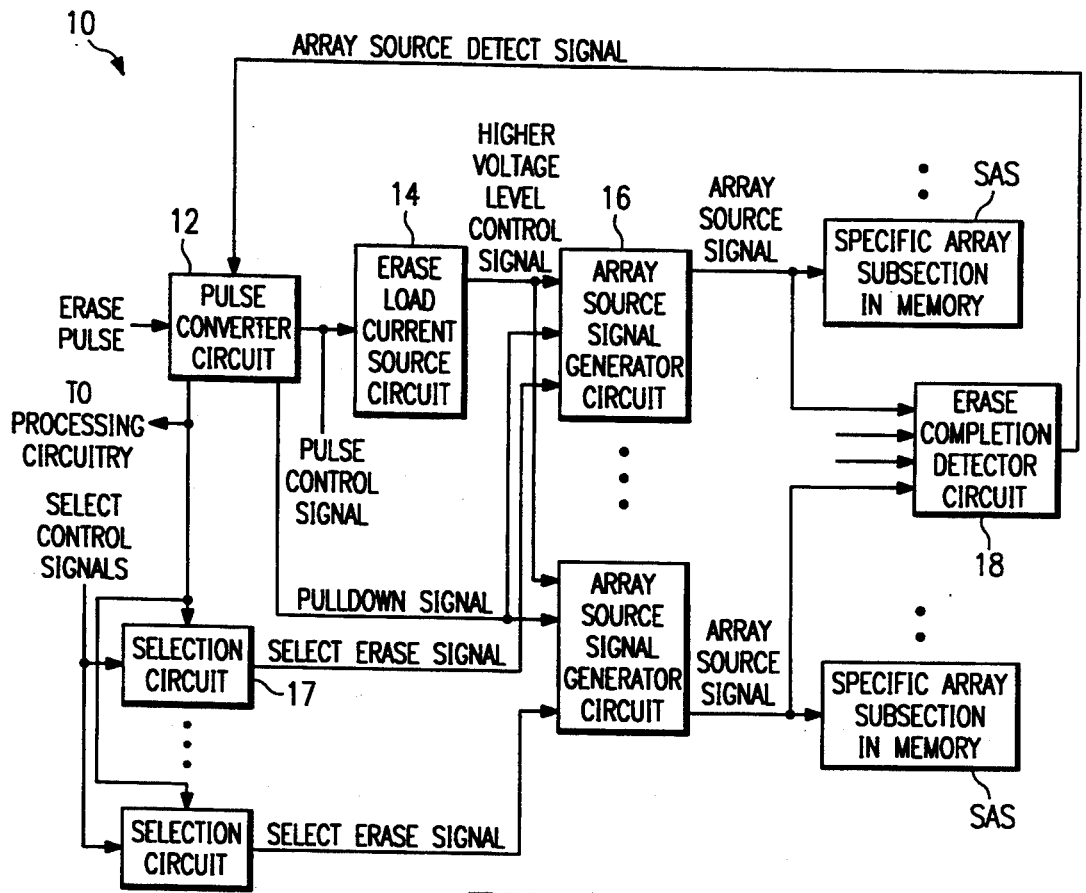
FIG. 1 illustrates a block diagram of a device for detecting and controlling an array source signal during a memory erase operation.

FIG. 1 is a block diagram of an array source signal discharge controller device 10. Array source signal discharge controller device 10 includes a pulse converter circuit 12 that receives an erase pulse signal and converts the erase pulse signal into a pulse control signal. The pulse control signal is inverted and translated into an appropriate higher voltage level control signal required for a memory erase operation by an erase load current source circuit 14. The higher voltage level control signal from erase load current source circuit 14 drives a plurality of array source signal generator circuits 16. Array source signal generator circuits 16 produce an array source signal at an appropriate voltage level for erasing particular array subsections within a memory as determined by select erase signals. The select erase signals are generated by selection circuits 17 in response to select control signals received by array source signal discharge controller device 10.

Array source signal generator circuits 16 also provide array source command signals, a function of the array source signal, for an erase completion detector circuit 18 in order to determine when the memory erase operation has been completed. Array source signal generator circuits 16 receive a pulldown signal from pulse converter circuit 12 to control discharge of the array source signals. Erase completion detector circuit 18 provides an array source detect signal indicating the completion of the memory erase operation and the discharge of the array source signals. Pulse converter circuit 12 receives the array source detect signal and generates an erase completion signal for use in controlling the select erase signals for further array source signal pulldown and to indicate when normal memory read/write access may resume.

In operation, the memory erase operation is initiated by the sending of the erase pulse signal. Pulse converter circuit 12 receives the erase pulse signal and converts the erase pulse signal into a pulse control signal to drive erase load current source circuit 14. Erase load current source circuit 14 translates the pulse control signal into a higher voltage level control signal typically required in memory devices for memory erase operations. For instance, normal circuits in memory devices operate off of a five volt supply source. To perform a memory erase operation, a twelve volt signal is typically applied to the memory device. Erase load current source circuit 14 may translate the pulse control signal at a five volt voltage level to a signal with a twelve volt voltage level depending upon the power requirements for the memory device. The higher voltage level control signal translated from the pulse control signal drives array source signal generator circuits 16.

Array source signal generator circuits 16 generate and send the array source signals to corresponding array subsections in the memory device. The select erase signals from selection circuits 17 determine which array source signal generator circuits 16 provide array source signals to corresponding array subsections. Select control signals received by array source signal discharge controller device 10 are processed by selection circuits 17 to drive the select erase signals to each array source signal generator circuit 16. Array source signal generator circuits 16 also provide array source signals to erase completion detector circuit 18.

Erase completion detector circuit 18 monitors each array source command signal and generates an array source detect signal indicating that the array source signals have discharged to a certain threshold level. Array source detect signal is fed back to pulse converter circuit 12 that generates an erase completion signal in response to the array source detect signal to control the select erase signals of selection circuits 17 for strong pulldown of the array source signals from the threshold level to a zero volt level and to indicate that the erase cycle has completed and trigger resumption of normal memory access. Pulse converter circuit 12 also provides a weak pulldown signal to array source signal generator circuits 16 to control the initial discharge of the array source signals in order to prevent the appearance of current surges on the array source signals during discharge.

Figure 2:
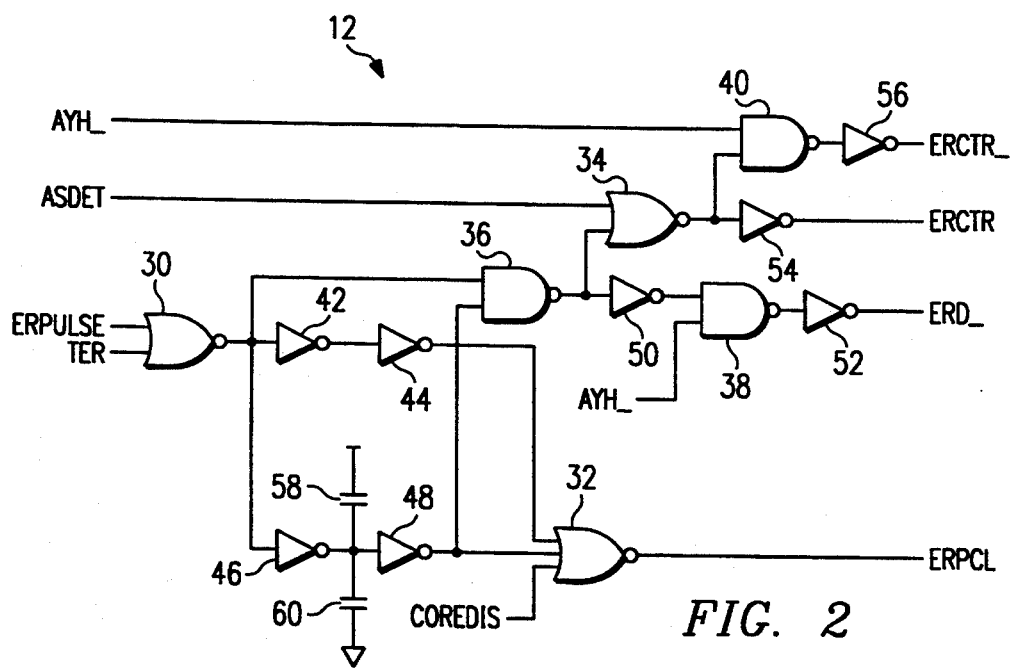
FIG. 2 illustrates a schematic diagram of the pulse converter circuit block for the array source signal detection device.

FIG. 2 is a schematic diagram of pulse converter circuit 12. Pulse converter circuit 12 includes NOR gates 30, 32, and 34, NAND gates 36, 38, and 40, inverters 42, 44, 46, 48, 50, 52, 54, and 56, and capacitors 58, and 60. Pulse converter circuit 12 receives erase pulse signal ERPULSE at one input of NOR gate 30. The second input of NOR gate 30 is a test signal TER which is at a low level state during normal operation. NOR gate 32 receives the inversion of erase pulse signal ERPULSE after NOR gate 30, inverter 42, and inverter 44 operation at a first input and the inversion of erase pulse signal ERPULSE after NOR gate 30, inverter 46, inverter 48, and capacitors 58 and 60 operation at a second input. A third input is a test signal COREDIS which is set to a low level state during normal operation. The output of NOR gate 32 is pulse control signal ERPCL which is essentially a replication of erase pulse signal ERPULSE with some timing delay at the rising edge.

Pulse converter circuit 12 also generates a pulldown signal ERD_ which is essentially an inversion of erase pulse signal ERPULSE after it propagates through NOR gate 30, NAND gate 36, inverter 50, NAND gate 38, and inverter 52. NAND gate 36 receives at one input the output of NOR gate 30 and the second input is tied to the second input of NOR gate 32. The result of NAND gate 36 is inverted by inverter 50 and then received at one input of NAND gate 38. The second input of NAND gate 38 is a test signal AYH_ which is set to a high level state during normal operation. The result of NAND gate 38 is inverted by inverter 52 to produce pulldown signal ERD_ that is used to reduce current surges during initial discharge of the array source signal.

Pulse converter circuit 12 also receives array source detect signal ASDET at one input of NOR gate 34. NOR gate 34 also receives erase pulse signal ERPULSE at its second input after propagating through NOR gate 30 and NAND gate 36. The output of NOR gate 34 is inverted by inverter 54 to produce erase completion signal ERCTR that determines the completion of the erase cycle. A pulldown control signal ERCTR_ is also provided by pulse converter circuit 12 through NAND gate 40 and inverter 56. As to be discussed, pulldown control signal ERCTR_, coupled with the select erase signals through selection circuits 17, performs a final discharge, causing the array source signal to completely discharge to zero volts from a threshold level that triggered array source detect signal ASDET.

Figure 3:
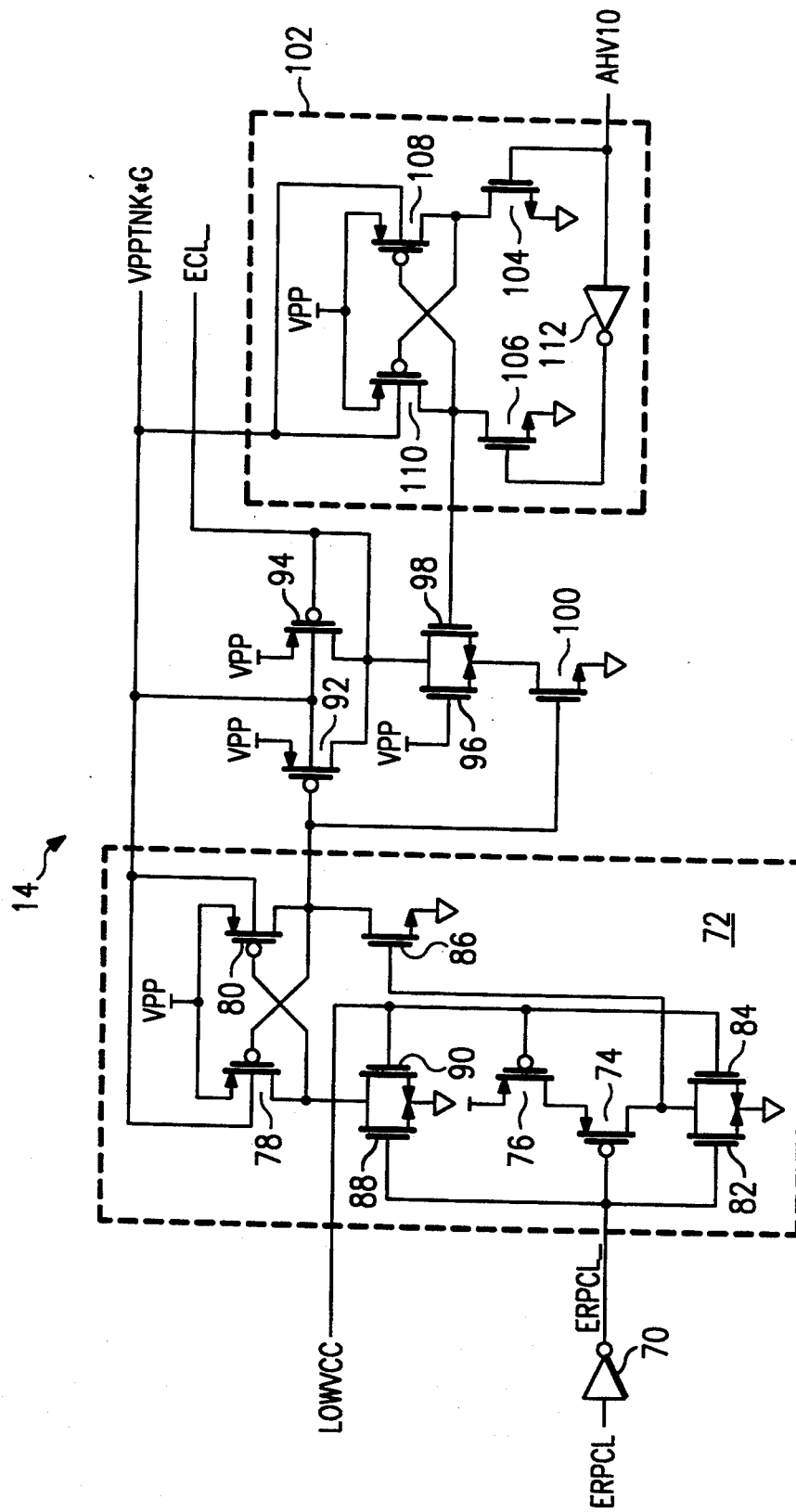
FIG. 3 illustrates a schematic diagram of the erase load current source circuit block in the device.

FIG. 3 is a schematic diagram of erase load current source circuit 14. Erase load current source circuit 14 includes an inverter 70 for receiving and inverting pulse control signal ERPCL. Inverted pulse control signal ERPCL_ is received by a voltage translator circuit 72 comprising P-channel transistors 74, 76, 78, and 80, and N-channel transistors 82, 84, 86, 88, and 90. The output of voltage translator circuit 72 is a high voltage form of the pulse control signal as converted to an appropriate voltage level for the memory erase operation as required by the memory device. Erase load current source circuit 14 also includes P-channel transistors 92 and 94 and N-channel transistors 96, 98, and 100. These transistors act as a current mirror to receive the output of voltage translator circuit 72 and generate an appropriate high voltage level bias signal ECL_ for use in generating the array source signal for the memory erase operation and limit current during a memory erase. Erase load current source circuit 14 may also include an optional voltage translator circuit 102 comprising N-channel transistors 104 and 106, P-channel transistors 108 and 110, and inverter 112 for generating a high voltage level signal during circuit testing. Voltage translator circuit 102 provides a five-fold increase in current within erase load current source circuit 14 by activating transistor 98 in order to accelerate stress on the circuit during testing. Signal LOWVCC is received from an external low power detection circuit and inhibits operation of voltage translator circuit 72 until proper power supply voltage is available. Signal VPPTNK*G is normally equivalent to high voltage source VPP during a memory erase operation.

Figure 4:
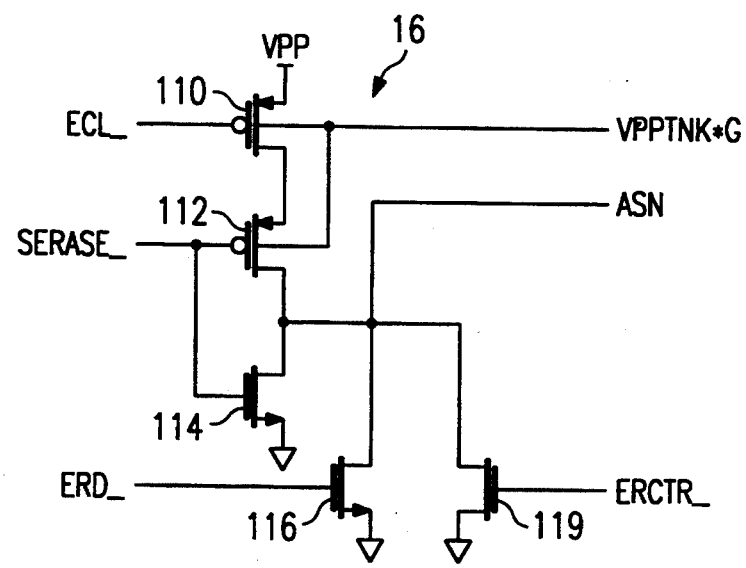
FIG. 4 illustrates a schematic diagram of the array source signal generator circuit block of the device.

FIG. 4 is a schematic of one array source signal generator circuit 16. Array source signal generator circuit 16 includes P-channel transistors 110 and 112, and N-channel transistors 114, 116, and 119. Array source signal generator circuit 16 receives high voltage level bias signal ECL_ translated from pulse control signal ERPCL by erase load current source circuit 14 in order to generate array source signal AS. A select erase signal SERASE_ determines whether the array subsection within the memory device corresponding to this array source signal generator circuit 16 is to be erased.

Array source signal generator circuit 16 also receives pulldown signal ERD_ from pulse converter circuit 12 in order to control the initial discharge of array source signal AS. Array source signal AS drives the corresponding array subsection in memory during a memory erase operation. Array source signal generator circuit 16 also receives pulldown signal ERCTR_ from pulse converter circuit 12 in order to control the final discharge of array source signal AS through a large discharge transistor 119.

When erase pulse signal ERPULSE is introduced into the circuit, high voltage level bias signal ECL_ is driven low during the pulse duration and turns on transistor 110. Transistor 110 acts as a fixed current source by mirroring the current through transistor 94 of erase load current source circuit 14. If this array source signal generator circuit 16 has a corresponding array subsection in memory selected for erasure, select erase signal SERASE_ is placed in a low level state, turning on transistor 112 and turning off transistor 114 to drive array source signal AS to a high voltage level state from supply voltage VPP. Pulldown signal ERD_ is placed at a low level state during the duration of erase pulse signal ERPULSE, turning off transistor 116.

When erase pulse signal ERPULSE returns to a low level state, high voltage level bias signal ECL_ returns to a high level state, turning off transistor 110. Since transistor 110 is turned off, array source signal AS is no longer connected to high voltage supply VPP and thus slowly begins to discharge. Pulldown signal ERD_ changes to a high level state, turning on small transistor 116 and controlling the discharge of array source signal AS by preventing current surges to occur on array source signal AS. Current surges may disturb the state of the memory and delay in read access time. Since array source signal AS has a high capacitance that may cause current surges if switched too fast, small transistor 116 ensures that array sources signal AS discharges at a reduced rate to prevent current surges from appearing. Each array source signal generator circuit 16 operates, in response to the bias signal, to activate a specific array subsection SAS in a memory for erasure. The array source signals combine in the circuit of FIG. 5 to generate an array source detect signal to indicate an active status of the array source signals. Each array source signal generator circuit 16 receives a select erase signal to indicate whether a specific array subsection SAS corresponding to each array source signal generator circuit 16 is to be erased.

Figure 5:
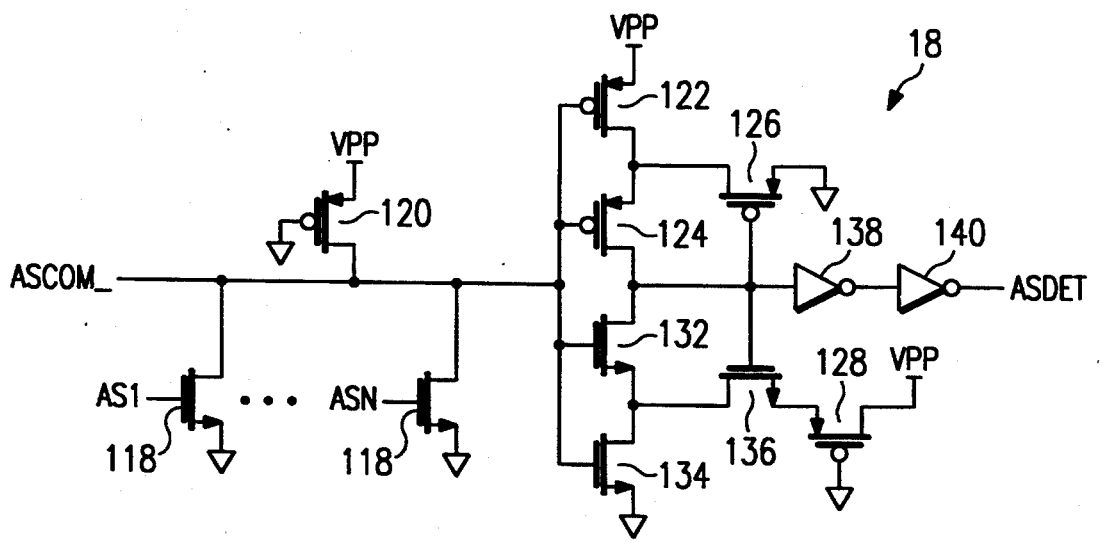
FIG. 5 illustrates a schematic diagram of the erase completion detector circuit block of the device.

FIG. 5 is a schematic diagram of erase completion detector circuit 18. Erase completion detector circuit 18 includes P-channel transistors 120, 122, 124, 126, and 128, N-channel transistors 118, 132, 134, and 136, and inverters 138 and 140. An array source command signal ASCOM_ indicates an active discharge state of array source signal AS. As array source signal AS is driven to a high voltage state, a transistor 118 turns on and connects array source command signal ASCOM_ to ground, placing array source command signal ASCOM_ at a low level state. As array source signals AS discharge to threshold levels of transistors 118, array source command signal ASCOM_ changes to a high level state as transistors 118 turn off. With the introduction of erase pulse signal ERPULSE, array source command signal ASCOM_ is pulled to a low level state as array source signal AS is brought up to a high voltage level state. After erase pulse signal ERPULSE returns to a low level state, array source command signal ASCOM_ remains at a low level state as array source signal AS begins to discharge. With array source command signal ASCOM_ at a low level state, array source detect signal ASDET will be at a high level state after the low level signal propagates through transistors 122, 124, 126, 128, 132, 134, and 136, making up an inverter with hysteresis and through inverter 138 and inverter 140. A high level signal on array source detect signal ASDET indicates that the array source signal AS is charged to a high voltage level.

When array source signals AS discharge to the threshold level of transistors of FIG. 5, array source command signal ASCOM_ returns to a high level state assisted by pull-up transistor 120. Transistors 122, 124, 126, 128, 132, 134, and 136 act as an inverter with hysteresis and convert the high level signal of array source command signal ASCOM_ into a low level signal at the input of inverter 138. Inverter 138 generates a high level state as an input to inverter 140 that subsequently generates a low level state on array source detect signal ASDET. The low level state on array source detect signal ASDET places erase completion signal ERCTR at a low level state and pulldown control signal ERCTR_ at a high level state in pulse converter circuit 12 of FIG. 2, indicating that the memory erase operation has completed. The high level state at pulldown control signal ERCTR_ activates large pulldown transistor 119 in the array source signal generator circuit 16 to control the final discharge by quickly discharging array source signal AS completely to ground potential.

Figure 6:
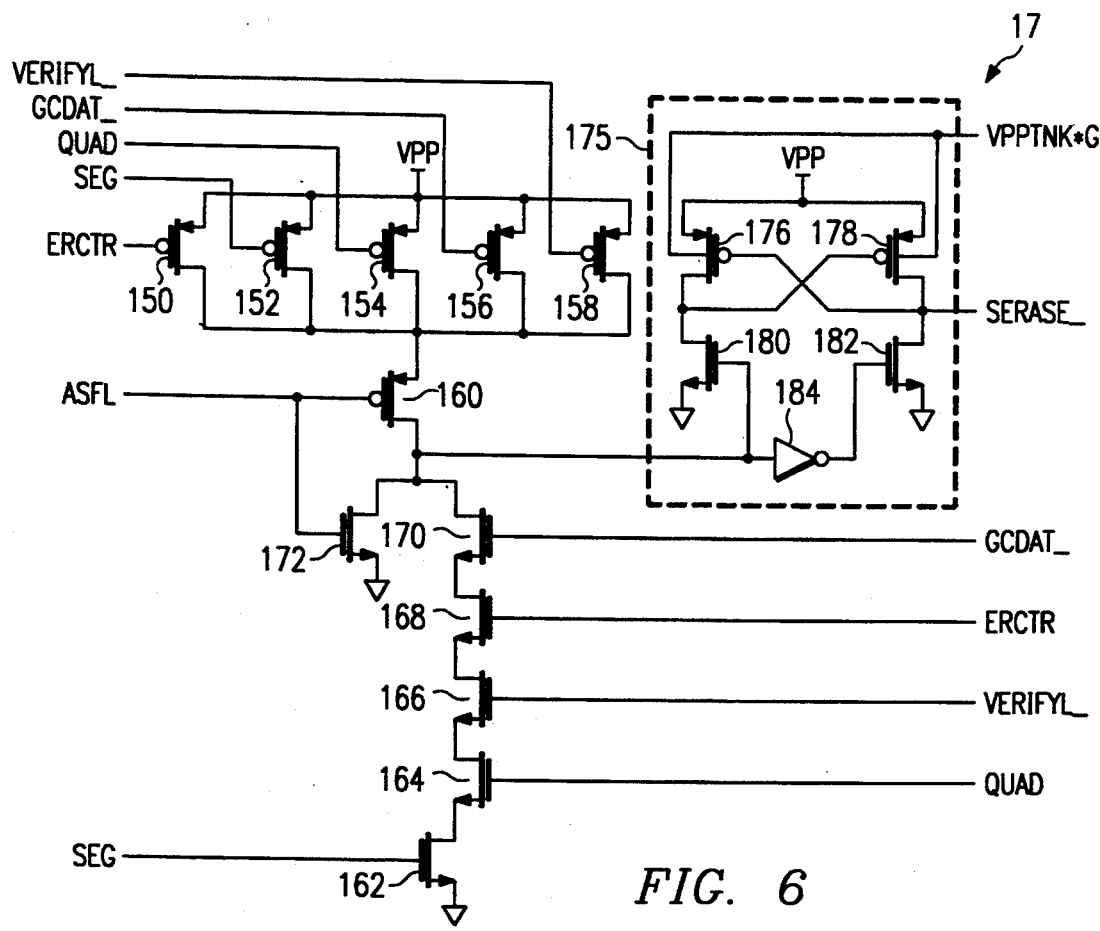
FIG. 6 illustrates a schematic diagram of the selection circuit block of the device.

FIG. 6 is a schematic diagram of one selection circuit 17 corresponding to one of array source signal generator circuits 16. Selection circuit 17 includes P-channel transistors 150, 152, 154, 156, 158, and 160, N-channel transistors 162, 164, 166, 168, 170, and 172, and voltage translator 175 made up of P-channel transistors 176 and 178, N-channel transistors 180 and 182, and invertor 184. Selection circuit 17 receives select control signals SEG, QUAD, VERIFYL_, and GCDAT_ that determine whether corresponding array source signal generator circuit 16 generates an array source signal AS. If selection is desired, select control signals SEG, QUAD, VERIFYL_, and GCDAT_ transition to a high level state to turn on transistors 162, 164, 166, and 170, respectively. When erase pulse signal ERPULSE is introduced into pulse convertor circuit 12 of FIG. 2, erase completion signal ERCTR transitions to a high level state to turn on transistor 168 and place select erase signal SERASE_ at a low level state in order to connect array source signal AS of FIG. 4 to voltage supply VPP.

When array source signals AS have discharged to the threshold levels of transistors 118 in FIG. 5, array source command signal ASCOM_ drives array source detect signal ASDET to a low level state. Array source detect signal ASDET is fed back to pulse converter circuit 12 of FIG. 2 and forces erase completion signal ERCTR to a low level state and pulldown control signal ERCTR— to a high level state. The low level state of erase completion signal ERCTR turns off transistor 168 and turns on transistor 150, placing select erase signal SERASE— at a high level state. The high level state of select erase signal SERASE— turns on pulldown transistor 114 and the high level on signal ERCTR— turns on large transistor 119 of FIG. 4, completing the pulldown of array source signal AS for the final discharge from the threshold voltage level of transistor 118 to a zero volt level. Transistor 160 receives a test signal ASFL that is at a low level state during normal operation. Voltage translator 175 is used to place select erase signal SERASE— to the appropriate higher voltage level as similarly done in erase load source current circuit 14. Erase completion signal ERCTR is used further by processing circuitry to indicate that the memory erase operation has completed and normal memory access may resume.

Figure 7:
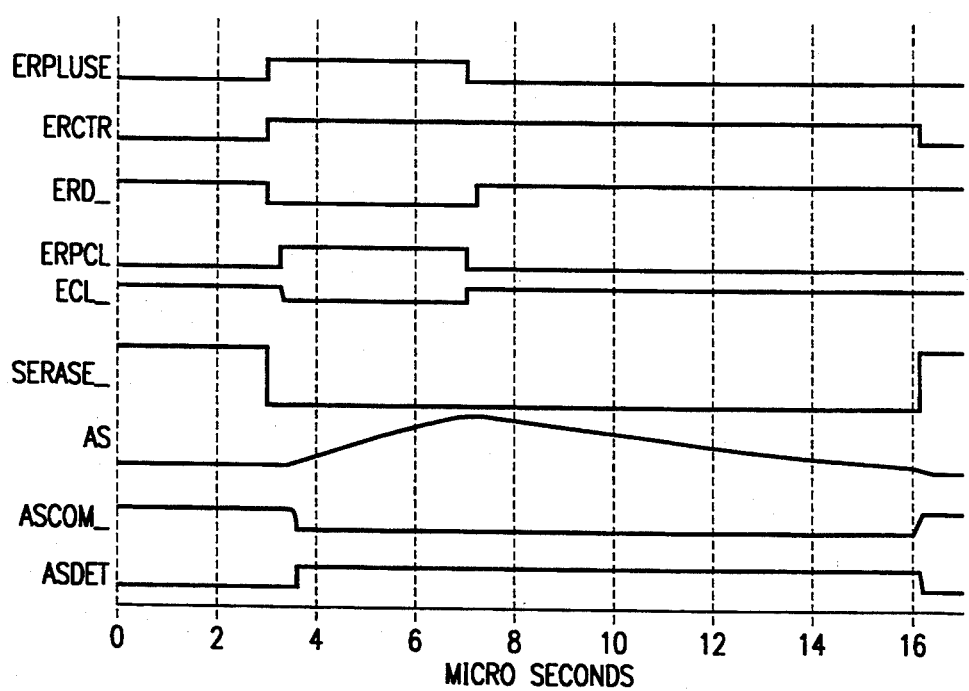
FIG. 7 illustrates a timing diagram that includes important signal transitions during operation of the device.

FIG. 7 is a timing diagram for array source signal discharge controller device 10. Erase pulse signal ERPULSE transitions to a high level state, indicating that a memory erase operation is desired. The high level state on erase pulse signal ERPULSE within pulse converter circuit 12 drives pulse control signal ERPCL to a high level state, erase completion signal ERCTR to a high level state, pulldown control signal ERCTR— to a low level state, and pulldown signal ERD— to a low level state. Pulse control signal ERPCL is inverted and translated to a high voltage level state by erase load current source circuit 14 to produce high voltage level bias signal ECL—. The bias level state of high voltage level bias signal ECL—, coupled with the low level state of select erase signal SERASE— to indicate an appropriate array subsection of the memory device to be erased, starts the charging of array source signal AS to a high voltage level state.

After the duration of erase pulse signal ERPULSE is completed, pulse control signal ERPCL returns to a low level state, causing high voltage level bias signal ECL— to return to a high voltage level state and removing the charging voltage VPP to array source signal AS. Pulldown signal ERD— returns to a high level state and controls the slower initial discharge of array source signal AS in order to prevent current surges from occurring on array source signal AS during discharge. As array source signal AS began charging, array source command signal ASCOM— transitioned to a low level state and forced array source detect signal ASDET to transition to a high level state.

The states of array source command signal ASCOM— and array source detection signal ASDET remain unchanged until array source signal AS discharges to the threshold level of transistor 118. Upon reaching the threshold level, array source command signal ASCOM— returns to the high level state and forces array source detect signal ASDET back to a low level state. The low level state on a array source detect signal ASDET forces erase completion signal ERCTR back to a low level state which in turn places select erase signal SERASE— and pulldown control signal ERCTR— in a high level state in order to complete the pulldown of array source signal AS for the final discharge from the threshold level to a zero volt level through transistor 114 and large transistor 119. Erase completion signal ERCTR is used by processing circuitry to indicate the completion of the memory erase operation and the capability to resume normal memory access as desired. Erase completion signal ERCTR makes it unnecessary to wait a certain period of time before normal memory access can resume after a memory erase operation.

Referring again to FIG. 1, it should be noted that the signal path designated PULLDOWN SIGNALS transmits both the pulldown control signal ERCTR— and the pulldown signal ERD—.

In summary, an array source signal discharge controller device monitors and controls the discharge of an array source signal that is used to erase a particular array subsection of a memory device. The array source signal discharge controller device generates an erase completion signal to indicate that a memory erase operation has completed so that normal memory access may resume. The array source signal discharge controller device also prevents current surges from appearing on the array source signal during discharge.

Thus, it is apparent that there has been provided, in accordance with the present invention, an array source signal discharge controller device and method that satisfy the advantages set forth above. Although the preferred embodiment has been described in detail, it should be understood that various changes, substitutions, and alterations can be made herein. For example, many of the direct connection illustrated herein can be altered by one skilled in the art such that two components are merely coupled to one another through an intermediate component or components without being directly connected as illustrated herein. Other examples are readily ascertainable by one skilled in the art and could be made without departing from the spirit and scope of the present invention as defined by the following claims.

What is claimed is:

1. A device for detecting and controlling array source signal discharge in a memory erase operation, comprising:

a pulse converter circuit for receiving an erase pulse signal and generating a pulse control signal in response thereto;

an erase load current source circuit for inverting and translating said pulse control signal into a bias signal having a higher voltage level necessary for the memory erase operation;

a plurality of array source signal generator circuits, each said array source signal generator circuit generating an array source signal in response to said bias signal, each said array source signal operable to activate a specific array subsection in a memory for erasure; and an erase completion detection circuit for monitoring said array source signals and generating an array source detect signal in response to said array source signals indicating that said array source signals have discharged to a certain threshold level after removal of said pulse control signal in order to identify a completion of said memory erase operation;

wherein said array source detect signal is generated upon said array source signals discharging to the certain threshold level, said pulse converter circuit receiving said array source detect signal and generating an erase completion signal in response thereto, said erase completion signal controlling the discharge of said array source signals from said threshold level to a zero voltage level and indicating that normal memory access may resume.

2. The device of claim 1, wherein each array source signal generator circuit receives a select erase signal to indicate whether a specific array subsection corresponding to each array source signal generator circuit is to be erased.

3. The device of claim 1, wherein said pulse converter circuit generates a pulldown signal in response to said discharge of said array source signals to prevent current surges from occurring on said array source signals during discharge.

* * * * *